United States Patent
Lee et al.

(10) Patent No.: US 9,911,793 B2
(45) Date of Patent: Mar. 6, 2018

(54) FOLDABLE DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Jaeseob Lee, Yongin-si (KR); Youngshin Pyo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/188,813

(22) Filed: Jun. 21, 2016

(65) Prior Publication Data

US 2017/0084673 A1    Mar. 23, 2017

(30) Foreign Application Priority Data

Sep. 23, 2015   (KR) .......................... 10-2015-0134819

(51) Int. Cl.

| H01L 27/32 | (2006.01) |
|---|---|
| H01L 51/00 | (2006.01) |
| H01L 51/52 | (2006.01) |
| H01L 51/56 | (2006.01) |
| G06F 1/16 | (2006.01) |

(52) U.S. Cl.
CPC ........ *H01L 27/3244* (2013.01); *G06F 1/1643* (2013.01); *G06F 1/1652* (2013.01); *H01L 27/323* (2013.01); *H01L 51/0097* (2013.01); *H01L 51/5237* (2013.01); *H01L 51/5253* (2013.01); *H01L 51/56* (2013.01); *H01L 2227/323* (2013.01); *H01L 2251/5338* (2013.01)

(58) Field of Classification Search
CPC ........................ H01L 27/3244; G06F 1/1643
USPC ............................................................ 257/72
See application file for complete search history.

(56) References Cited

U.S. PATENT DOCUMENTS

| 2014/0111954 A1* | 4/2014 | Lee .................. G06F 1/1641 361/749 |
|---|---|---|
| 2014/0267950 A1* | 9/2014 | Kang ................ G06F 1/1652 349/12 |
| 2014/0295150 A1* | 10/2014 | Bower .................. C09J 7/02 428/201 |
| 2014/0300529 A1 | 10/2014 | Kim et al. |
| 2014/0355195 A1 | 12/2014 | Kee et al. |
| 2015/0036269 A1 | 2/2015 | Kim et al. |
| 2015/0049428 A1 | 2/2015 | Lee et al. |

FOREIGN PATENT DOCUMENTS

| JP | 5-302400 A | 11/1993 |
|---|---|---|
| JP | 2014-99994 A | 5/2014 |
| KR | 10-2011-0072813 A | 6/2011 |
| KR | 10-2014-0120585 A | 10/2014 |
| KR | 10-2014-0142004 A | 12/2014 |
| KR | 10-2015-0015224 A | 2/2015 |
| KR | 10-2015-0021167 A | 3/2015 |

* cited by examiner

*Primary Examiner* — Moazzam Hossain
*Assistant Examiner* — Warren H Kilpatrick
(74) *Attorney, Agent, or Firm* — Lewis Roca Rothgerber Christie LLP (57) ABSTRACT

A foldable display apparatus includes a flexible display panel and a case. The flexible display panel includes a protection film, and the case supports the flexible display panel. A folding portion of the protection film includes a curing zone that is hardened more than other areas of the protection film

20 Claims, 6 Drawing Sheets

FOLDABLE DISPLAY APPARATUS AND METHOD OF MANUFACTURING THE SAME

CROSS-REFERENCE TO RELATED APPLICATION

This application claims priority to and the benefit of Korean Patent Application No. 10-2015-0134819, filed on Sep. 23, 2015 in the Korean Intellectual Property Office, the disclosure of which is incorporated herein by reference in its entirety.

BACKGROUND

1. Field

One or more exemplary embodiments relate to a foldable display apparatus and a method of manufacturing the same.

2. Description of the Related Art

Generally, a flat display apparatus, such as an organic light-emitting display apparatus, has flexibly deformable characteristics. Accordingly, such a display apparatus may have a foldable structure (e.g., may be foldable) to provide enhanced portability to a user.

However, when the foldable flat display apparatus is repeatedly folded and unfolded, tensile force is repeatedly applied to a folding portion of the foldable flat display apparatus, which may cause a protection film of the foldable flat display apparatus to delaminate.

SUMMARY

One or more exemplary embodiments include a foldable display apparatus and a method of manufacturing the same that reduces or prevents delamination problems of a protection film of the foldable display apparatus.

Additional aspects will be set forth, in part, in the description which follows and, in part, will be apparent from the description or may be learned by practice of the presented embodiments.

According to one or more exemplary embodiments, a foldable display apparatus includes a flexible display panel including a protection film and a case supporting the flexible display panel. The folding portion of the protection film includes a curing zone, and the curing zone is hardened relatively more than other areas of the protection film.

According to one or more exemplary embodiments, the curing zone may be the entire folding portion of the protection film.

According to one or more exemplary embodiments, the curing zone may include a plurality of curing zones, and each of the curing zones may extend parallel to a folding axis of the flexible display panel.

According to one or more exemplary embodiments, the curing zone may include a plurality of curing zones, and each of the curing zones may extend perpendicular to a folding axis of the flexible display panel.

According to one or more exemplary embodiments, the curing zone may have an oval shape.

According to one or more exemplary embodiments, the flexible display apparatus may include a display layer configured to display an image, and the protection film may be on one surface of the display layer.

According to one or more exemplary embodiments, the flexible display panel may include a window on an opposite surface of the display layer as the protection film, and and the window may be arranged such that the displayed image is transmitted therethrough.

According to one or more exemplary embodiments, when the flexible display panel is folded, a tensile stress may be applied to the protection film and a compressive stress may be applied to the widow.

According to one or more exemplary embodiments, the flexible display panel may further include a touch screen panel and a polarization layer, each of the touch screen and the polarization layer may be between the display layer and the window, and a plurality of adhesive layers. Ones of the adhesive layers may be between adjacent ones of the protection film, the display layer, the touch screen panel, the polarization layer, and the window.

According to one or more exemplary embodiments, the protection film may include a polyimide.

According to one or more exemplary embodiments, a manufacturing method of a foldable display apparatus includes attaching a protection film to one surface of a flexible display panel, and irradiating a folding portion of the protection film with an ultraviolet laser beam to form a curing zone. The curing zone of t being hardened more than other areas of the protection film.

According to one or more exemplary embodiments, the forming the curing zone may include forming the curing zone to be the entire folding portion of the protection film.

According to one or more exemplary embodiments, the forming the curing zone may include forming plurality of curing zones, and each of the curing zones may extend parallel to a folding axis of the flexible display panel.

According to one or more exemplary embodiments, forming the curing zone may include forming a plurality of curing zones, and each of the curing zones may extend perpendicular to a folding axis of the flexible display panel.

According to one or more exemplary embodiments, the curing may have an oval shape.

According to one or more exemplary embodiments, the method may further include preparing the flexible display panel, and the preparing the flexible display panel may include forming a display layer to be on the protection film, and the display layer may be configured to display an image, and forming a window on an opposite surface of the display layer as the protection film. The window may be arranged such that the displayed image is transmitted therethrough.

According to one or more exemplary embodiments, the flexible display panel may be configured to be folded in a direction such that a tensile stress is applied to the protection film and a compressive stress is applied to the widow.

According to one or more exemplary embodiments, the preparing the flexible display panel may further include arranging a touch screen panel and a polarization layer to be between the display layer and the window, and arranging an adhesive layer between adjacent ones of the protection film, the display layer, the touch screen panel, the polarization layer, and the window.

According to one or more exemplary embodiments, the protection film may include a polyimide.

According to one or more exemplary embodiments, the irradiating the folding portion of the protection film with the ultraviolet laser beam may include irradiating the folding portion of the protection film with the ultraviolet layer beam for about 10 minutes to about 20 minutes.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

The presented exemplary embodiments may have different forms and should not be construed as being limited to the descriptions set forth herein. Accordingly, certain exemplary embodiments are merely described below, by referring to the figures, to explain aspects of the present inventive concept.

Reference will now be made in detail to exemplary embodiments, examples of which are illustrated in the accompanying drawings, wherein like reference numerals refer to like elements throughout.

As used herein, the singular forms "a" and "an" are intended to include the plural forms as well, unless the context clearly indicates otherwise.

It will be further understood that the terms "include," "including," "comprises," and/or "comprising" used herein specify the presence of the stated features or components but do not preclude the presence or addition of one or more other features or components.

It will be understood that when a layer, region, or component is referred to as being "on," "connected to," "coupled to," or "formed on" another layer, region, or component, it can be directly or indirectly on, connected to, coupled to, or formed on the other layer, region, or component. When an element is referred to as being "directly on," "directly connected to," "directly coupled to," or "directly formed on" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Sizes of components, elements, or layers in the drawings may be exaggerated for convenience of explanation. Because sizes and thicknesses of components, elements, or layers in the drawings may be arbitrarily illustrated for convenience of explanation, the following embodiments are not limited thereto.

Although certain embodiments may be described in a specific process order, the embodiments may be implemented differently; for example, the specific process order may be performed differently from the described order. For example, two consecutively described processes may be performed at substantially the same time or performed in an order opposite to the described order.

As used herein, the term "and/or" includes any and all combinations of one or more of the associated listed items. Expressions, such as "at least one of," when preceding a list of elements, modify the entire list of elements and do not modify the individual elements of the list. Further, the use of "may" when describing embodiments of the present invention relates to "one or more embodiments of the present invention." Also, the term "exemplary" is intended to refer to an example or illustration.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein.

Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The scan driver, data driver, and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the scan driver and/or the data driver may be formed on one integrated circuit (IC) chip or on separate IC chips. Further, the various components of the scan driver and/or the data driver may be implemented on a flexible printed circuit film, a tape carrier package (TCP), a printed circuit board (PCB), or formed on a same substrate as the scan driver and/or the data driver. Further, the various components of the scan driver and/or the data driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

Figure 1:
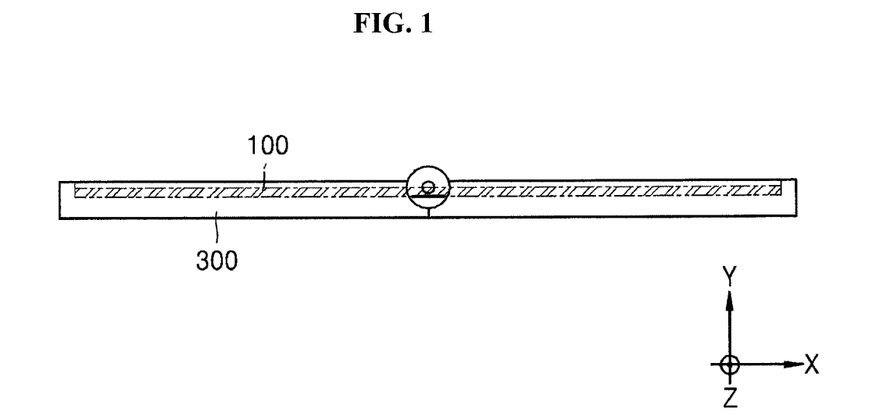
FIG. 1 is a side view illustrating an unfolded state of a foldable display apparatus according to an embodiment of the present inventive concept.
Figure 2:
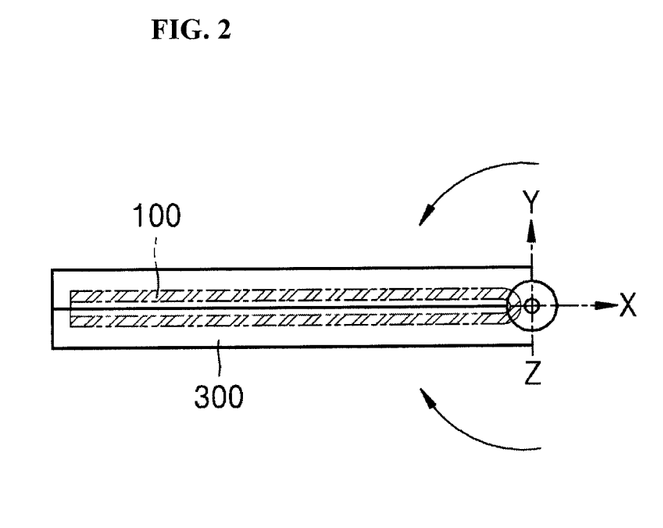
FIG. 2 is a side view illustrating a folded state of the foldable display apparatus shown in FIG. 1.

FIGS. 1 and 2 are side views respectively illustrating an unfolded state and a folded state of a foldable display apparatus according to an embodiment of the present inventive concept.

The foldable display apparatus includes a flexible display panel 100, which is flexibly bendable. The flexible display panel 100 includes a display layer 120 (FIG. 3A) including a lamination structure that is formed on a flexible substrate and includes a thin film transistor, a light-emitting element, and an encapsulation layer to cover and protect the thin film transistor and the light-emitting element. Because the flexible display panel 100 includes the flexible substrate instead of a rigid substrate (e.g., a rigid glass substrate), the flexible display panel 100 may be freely folded or unfolded within a range of allowed flexibility. Accordingly, the flexible display panel 100 may be folded as illustrated in FIG. 2

As illustrated in FIGS. 1 and 2, the flexible display panel 100 includes a case 300, which supports folding and unfolding of the flexible display panel 100. The flexible display panel 100 is folded or unfolded by rotating it together with the case 300. The flexible display panel 100 has opposite sides. One of the sides of the flexible display panel 100 is referred to as a front side and corresponds to a top surface of the flexible display panel 100 of FIG. 1 and also faces a user in a direction which the user views a displayed image, and the other side (e.g., the opposite side) of the flexible display panel 100 is referred to as a rear side and corresponds to a bottom surface of the flexible display panel 100.

Whenever the flexible display panel 100 is folded or unfolded, compressive stress and tensile stress are applied to a folding portion of the flexible display panel 100, at where the flexible display panel 100 is folded (e.g., is bent). For example, when the flexible display panel 100 is in the folded state as illustrated in FIG. 2, compressive stress is applied to the front side of the folding portion of the flexible display panel 100 and tensile stress is applied to the rear side of the folding portion of the flexible display panel 100. Because stress is applied in two different directions to the folding portion of the flexible display panel 100, delamination problems (e.g., delamination) may occur among layers of the flexible display panel 100. Furthermore, because maximum stress is applied to a protection film 110 (FIG. 3A), which is disposed at an outermost area of the flexible display panel 100, the protection film 110 may be delaminated from the flexible display panel 100 if suppression measures to prevent the delamination are not taken.

Figure 3A:
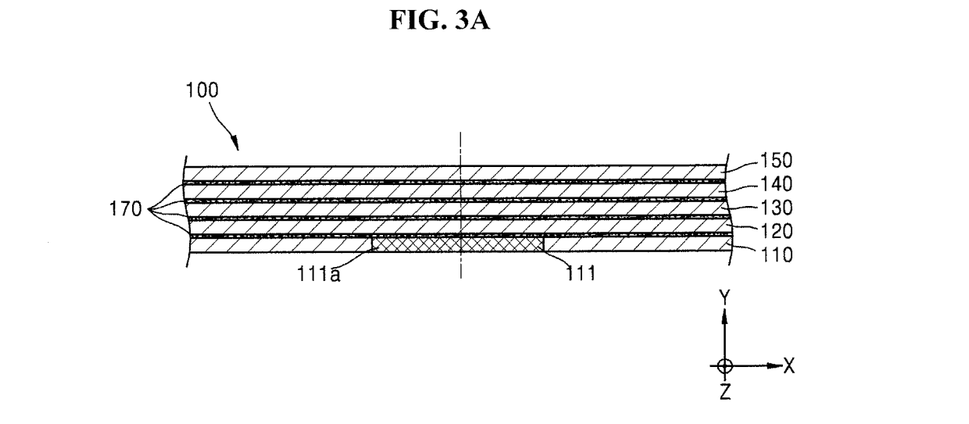
FIG. 3A is a cross-sectional view illustrating an unfolded state of a flexible display panel of the foldable display apparatus shown in FIG. 1.
Figure 3B:
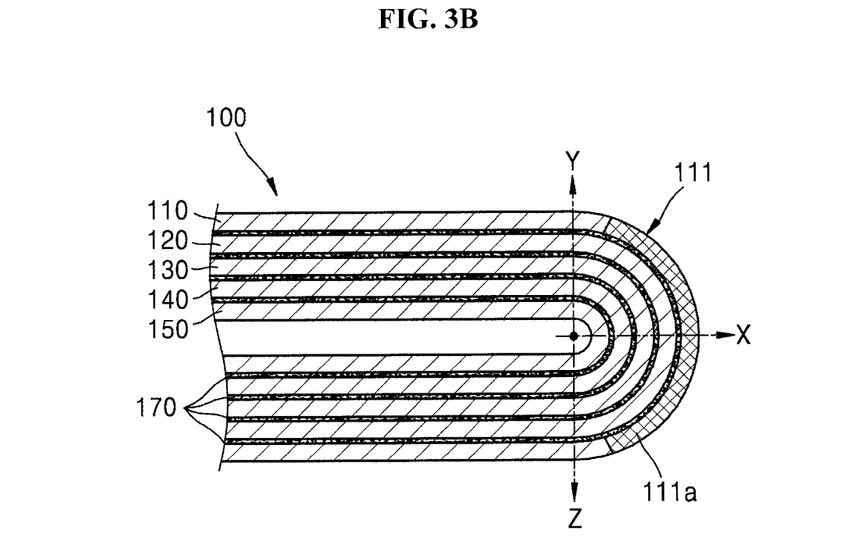
FIG. 3B is a cross-sectional view illustrating a folded state of the flexible display panel shown in FIG. 3A.

To reduce or prevent delamination among the layers of flexible display panel 100, a curing zone 111a is provided to a folding portion 111 of the protection film 110 according to the present embodiment, as illustrated in FIGS. 3A and 3B. The curing zone 111a of the protection film 110 is an area of the folding portion 111 of the protection film 110 that is cured relatively more than other areas of the folding portion 111 of the protection film 110. When the curing zone 111a is formed in the folding portion 111 of the protection film 110, the delamination problems of the protection film 110 may be effectively reduced or prevented by the curing zone 111a. Further explanation of the above-discussed reduction or prevention the delamination will be described later. A lamination structure of the flexible display panel 100 will be described with reference to FIGS. 3A and 3B.

The flexible display panel 100 includes the display layer 120 and the protection film 110 attached to a rear side of the display layer 120. The flexible display panel 100 further includes a touch screen panel 130, a polarization layer 140, and a window 150, which are sequentially disposed on a front side of the display layer 120. An adhesive layer 170 may be disposed between adjacent layers of the flexible display panel 100.

When the flexible display panel 100 is folded as illustrated in FIG. 3B, maximum tensile stress is applied to the outermost protection film 110 and the folding portion 111 of the protection film 110 is in an elastically stretched state. However, when the folding portion 111 of the protection film is overstretched (e.g., is stretched beyond a certain degree or amount), the protection film 110 may not be rapidly restored to an original state thereof when the flexible display panel 100 is unfolded as illustrated in FIG. 3A. Thus, the flexible display panel 100 may be in a state in which the tensile stress is continuously applied to the folding portion 111 of the protection film 110 even when the flexible display panel 100 is unfolded to its original state. Therefore, the protection film 110 may be delaminated from the display layer 120 of the flexible display panel 100.

When the curing zone 111a is formed in the folding portion 111 of the protection film 110, the above-described overstretched phenomena (e.g., an excessively stretched phenomena) of the folding portion 111 of the protection film 110 may be suppressed when the flexible display panel 100 is folded. For example, due to the curing zone 111a, the folding portion 111 of the protection film 110 is hardened more than other portions of the protection film 110, and thus, the folding portion 111 of the protection film 110 may not be overstretched when tensile stress is applied to the folding portion 111 of the protection film 110. Because the folding portion 111 of the protection film 110 is not overstretched, the protection film 110 may be rapidly restored to its original state when the flexible display panel 100 is unfolded, and thus, the delamination problems of the protection film 110 may be sufficiently suppressed.

Figure 6:
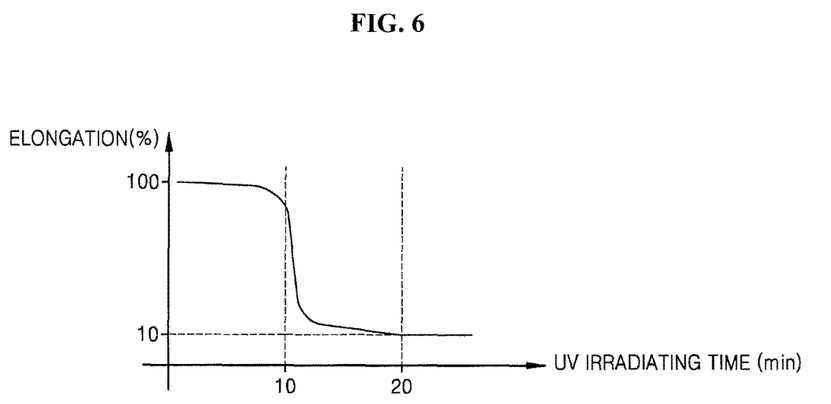
FIG. 6 is a graph illustrating a relationship between elongation and ultraviolet irradiating time with respect to a protection film of the flexible display panel shown in FIGS. 3A and 3B.

The protection film 110 may include a polyimide. In one embodiment, when an ultraviolet laser beam is irradiated to the protection film 110 for about 10 minutes to about 20 minutes, an area of the protection film 110 that is irradiated with the ultraviolet laser beam is relatively hardened more than other areas of the protection film 110 that are not irradiated with the ultraviolet laser beam. As illustrated in FIG. 6, an elongation characteristic of the protection film 110 is about 100% before irradiation. The elongation rapidly drops about 10 minutes after the irradiation and then the elongation characteristic of the protection film 110 becomes about 10% after about 20 minutes of irradiation. Then, the protection film 110 is not easily stretched because the protection film 110 is hardened by a curing process.

Accordingly, when the folding portion 111 of the protection film 110 is hardened by irradiating the folding portion 111 of the protection film 110 with the ultraviolet laser beam, the folding portion 111 of the protection film 110 is not overstretched when the flexible display panel 100 is folded and the folding portion 111 of the protection film 110 rapidly contracts when the flexible display panel 100 is unfolded. Accordingly, the above-discussed delamination problems are reduced or suppressed.

Figure 4A:
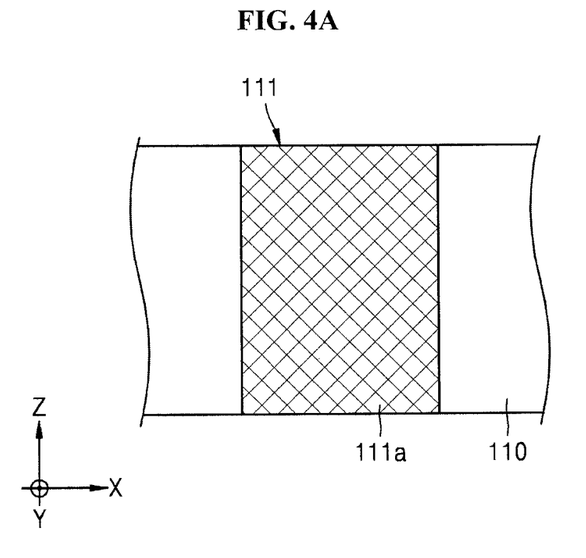
FIGS. 4A-4D are plan views illustrating curing zones formed on a folding portion of a protection film of the flexible display panel shown in FIGS. 3A and 3B.

As illustrated in FIG. 4A, the curing zone 111a of the folding portion 111 may be formed in an entire area (e.g., as a continuous area) of the folding portion 111 by being irradiated with the ultraviolet laser beam. In this embodiment, the entire folding portion 111 becomes the curing zone 111a and is not easily stretched when the flexible display panel 100 is folded, and thus, the above-discussed delamination problems are reduced or suppressed.

Figure 4B:
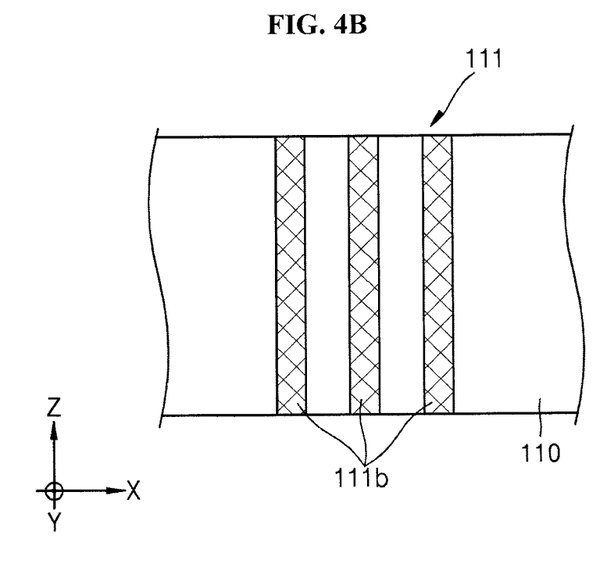
Figure 4C:
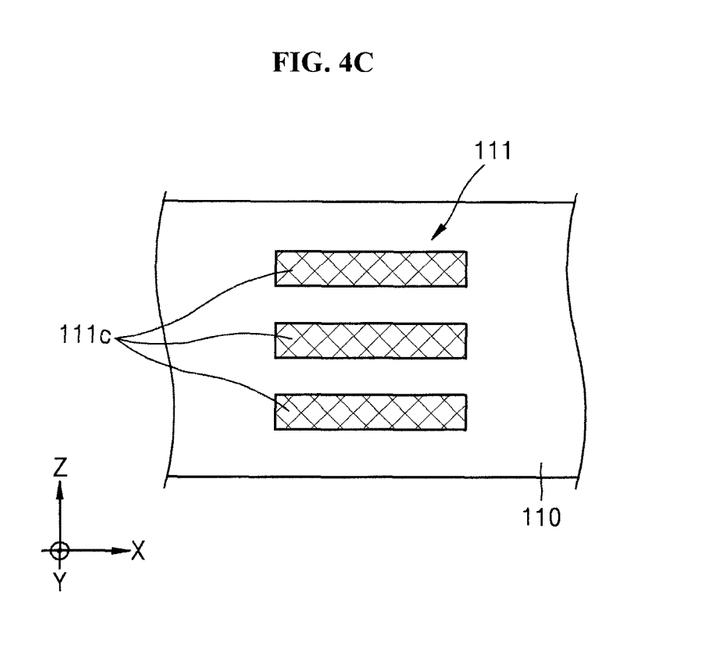
Figure 4D:
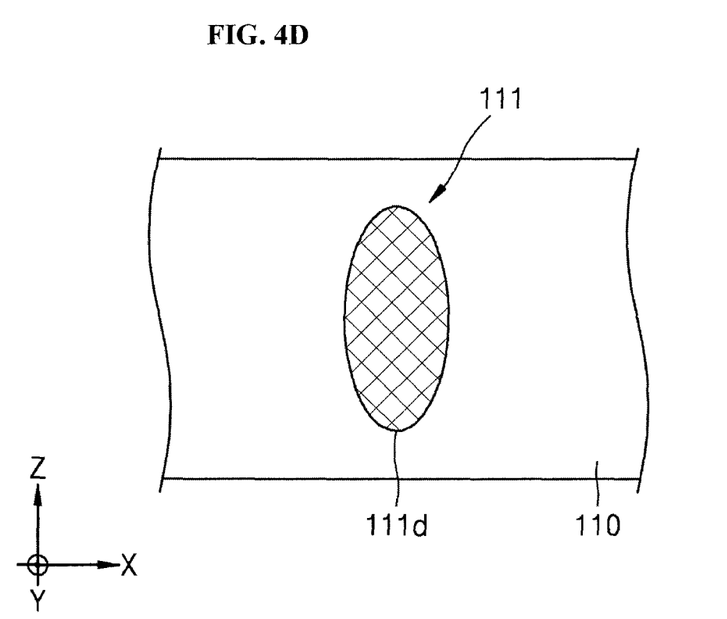

However, the curing zone 111a may not be formed in the entire area (e.g., may not be formed as a continuous area) of the folding portion 111. As illustrated in FIG. 4B, a plurality of curing zones 111b may be formed in the folding portion 111 to extend in a Z direction, which is a folding axis of the flexible display panel 100. As illustrated in FIG. 4C, a plurality of curing zones 111c may be formed in the folding portion 111 to extend perpendicular to the Z direction. As illustrated in FIG. 4D, a curing zone 111d may have a closed loop shape (e.g., an oval shape). Even when a curing zone is not formed in the entire area of the folding portion 111 (e.g., when the curing zone covers less than the entire area of the folding portion 111), such as is illustrated in the embodiments shown in FIGS. 4B-4D, the overstretching of the folding portion 111 of the protection film 110 is suppressed or reduced when the flexible display panel 100 is folded due to the curing zones. Also, the above-discussed delamination problems of the protection film 110 may be reduced or prevented when the flexible display panel 100 is repeatedly folded and unfolded.

A manufacturing method of the foldable display apparatus including the protection film 110 having the above-described structure will be further described later. An internal structure of the display layer 120 of the flexible display panel 100, which is attached to the protection film 110, will be further described hereinafter.

Figure 5A:
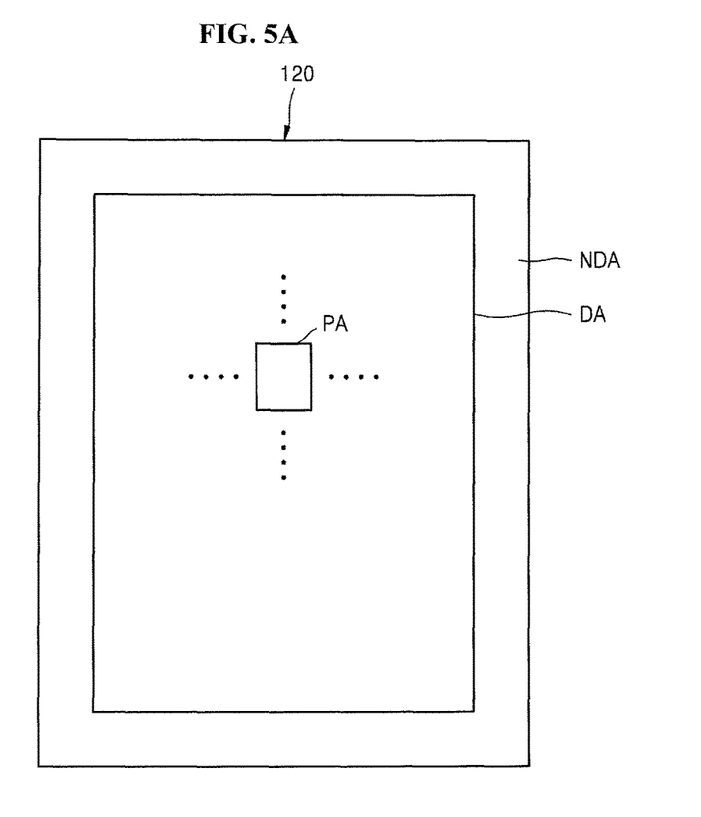
FIG. 5A is a plan view illustrating a display layer of the flexible display panel shown in FIG. 3A.

FIG. 5A is a plan view illustrating the display layer 120 shown in FIG. 3A. The display layer 120 includes a display area DA and a non-display area NDA, which is disposed adjacent to the display area DA. The display area DA includes a plurality of pixel areas PAs, and each pixel area PA includes a pixel configured to emit light. An image is generated by the light emitted from a plurality of pixels disposed in the display area DA.

The non-display area NDA may be disposed to surround the display area DA and may include a scan driver and a data driver configured to transmit signals to the plurality of pixels of the display area DA.

Although FIG. 5A illustrates the non-display area NDA surrounding the display area DA, the present inventive concept is not limited thereto. According to another exemplary embodiment, the non-display area NDA is disposed on a side of (e.g., on one or more sides of) the display area DA so as to reduce an area in which an image is not displayed, called a dead area.

Figure 5B:
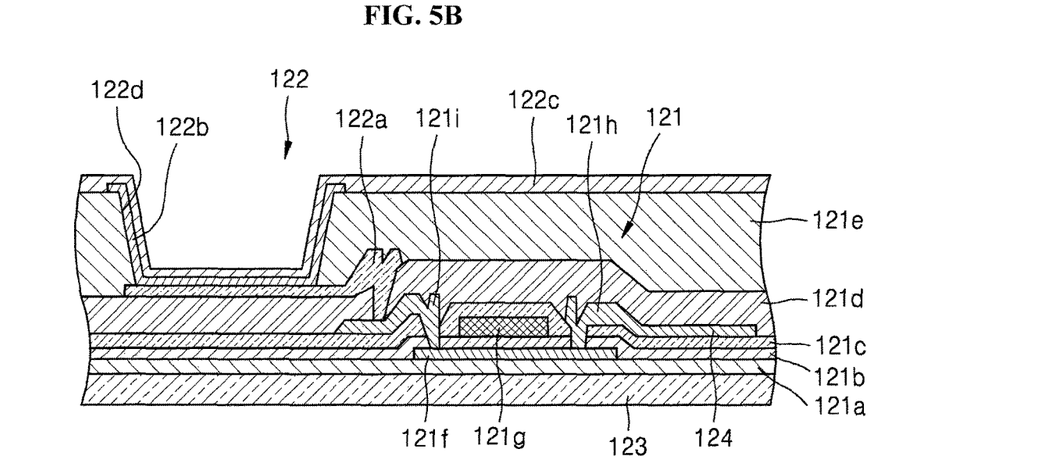
FIG. 5B is a cross-sectional view illustrating a structure of a display area of the display layer shown in FIG. 5A.

As illustrated in FIG. 5B, a thin film transistor 121 and an organic light-emitting element 122 are disposed in each pixel area PA of the display area DA. In the thin film transistor 121, an active layer 121f is formed on a buffer layer 121a, which is disposed on or adjacent to a flexible substrate 123. The active layer 121f is doped with a high density of N-type and/or P-type impurities to form a source area and a drain area. The active layer 121f may include an oxide semiconductor. For example, the oxide semiconductor may include a metal element of Groups 12, 13, and 14 of the periodic table, such as zinc (Zn), indium (In), gallium (Ga), tin (Sn), cadmium (Cd), germanium (Ge), or hafnium (Hf) or an oxide of a material selected from a combination of the above metal elements. For example, the active layer 121f may include gallium-indium-zinc oxide (G-I-Z-O [$(In_2O_3)_a(Ga_2O_3)_b(ZnO)_c$] where a, b, and c are real numbers satisfying and a≥0, b≥0, c>0]). A gate insulation film 121b is formed on the active layer 121f, and a gate electrode 121g is formed on the gate insulation film 121b. A source electrode 121h and a drain electrode 121i are formed above the gate electrode 121g, and an interlayer insulation film 121c is formed between the gate electrode 121g, the source electrode 121h, and the drain electrode 121i. A passivation film 121d is disposed between an anode 122a of the organic light-emitting element 122, the source electrode 121h, and the drain electrode 121i.

A planarization film 121e including an insulation material, such as an acryl, is formed on the anode 122a of the organic light-emitting element 122. An opening 122d is formed in a portion of the planarization film 121e, and the organic light-emitting element 122 is formed in the opening 122d.

The organic light-emitting element 122 may emit red, green, or blue light according to a current flow and may display image information. The organic light-emitting element 122 may include the anode 122a, which receives positive voltage power, a cathode 122c, which covers the entire pixel and receives negative voltage power, and a light-emitting layer 122b disposed between the anode 122a and the cathode 122c.

One or more of a hole injection layer (HIL), a hole transport layer (HTL), an electron transport layer (ETL) (e.g., an organic light-emitting electron transport layer), or an electron injection layer (EIL) (e.g., an organic light-emitting electron injection layer) may be disposed adjacent to (e.g., above or below) the light-emitting layer 122b.

The light-emitting layer 122b may be disposed in the respective pixels, and a unit pixel may be formed by pixels (e.g., sub-pixels) each emitting one of red, green, and blue light. In another embodiment, a common light-emitting layer may be formed on all of the pixel areas. In this embodiment, the common light-emitting layer may include layers including fluorescence materials emitting red, green, and blue light, respectively, and that are stacked in a vertical direction or combined together to emit white light. When the light-emitting layer emits white light, it is possible to combine the white light with another light color. Also, a color filter and a color converting layer to convert the emitted white light into a certain color may be further included in the light-emitting layer 122b.

An encapsulation layer may be formed on the cathode 122c and may include an organic film and an inorganic film, which are alternately stacked on the cathode 122c.

The flexible display panel 100 having a structure corresponding to the above-described display layer 120 may be flexible deformed. Therefore, the flexible display panel 100 may be used in a folded state and an unfolded state.

The foldable display apparatus having the above-described structure may be manufactured according to the following method.

As illustrated in FIG. 3A, the flexible display panel 100 is prepared by attaching the protection film 110 to one surface of the display layer 120 by using the adhesive layer 170 and sequentially attaching the touch screen panel 130, the polarization layer 140, and the window 150 to another surface of the display layer 120 by using adhesive layers 170.

Thereafter, an ultraviolet laser beam is irradiated onto the folding portion 111 of the protection film 110 for about 10 to about 20 minutes such that the curing zone (e.g., one or more of the curing zones 111a, 111b, 111c, and 111d described above with reference to FIGS. 4A-4D) are hardened.

Thereafter, the flexible display panel 100 having one or more of the curing zones 111a, 111b, 111c, and 111d in the folding portion 111 of the protection film 110 is combined with the case 300, as illustrated in FIG. 1.

When the foldable display apparatus, which may be manufactured according to the above-described manufacturing method, is stored or carried, the foldable display apparatus may be folded as illustrated in FIGS. 2 and 3B. When in the folded state, maximum tensile stress is exerted on the folding portion 111 of the outermost protection film 110. However, because the hardened curing zone 111a, 111b, 111c, or 111d is formed in the folding portion 111, the folding portion 111 is not overstretched despite repeated folding operations.

In addition, a user may view an image by unfolding the foldable display apparatus to a flat state. Here, because the curing zone 111a, 111b, 111c, or 111d has not been overstretched during the folding operation, the folding portion 111 may rapidly contract to its original shape.

Although the presented embodiments illustrate examples in which the curing zones 111a, 111b, 111c, and 111d are formed by irradiating the protection film 110, which is attached to the flexible display panel 100, with the ultraviolet laser beam, it is possible that the curing zones 111a, 111b, 111c, and 111d may be formed by irradiating the protection film 110 with the ultraviolet laser beam before the protection film 110 is attached to the flexible display panel 100. In this embodiment, once the protection film 110 is irradiated, the protection film 110 having the curing zone 111a, 111b, 111c, or 111d may be attached to one surface of the display layer 120 of the flexible display panel 100.

Because the foldable display apparatus described above reduces or prevents the delamination phenomena of a protection film in a folding portion of the flexible display panel, product quality of the foldable display apparatus having the above-described structure becomes stable.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While exemplary embodiments have been described herein with reference to the figures, it will be understood by those of ordinary skill in the art that various changes in form and details may be made therein without departing from the spirit and scope as defined by the following claims and their equivalents.

What is claimed is:

1. A foldable display apparatus comprising:
   a flexible display panel comprising a protection film, the flexible display panel being configured to be bent about an axis, a folding portion of the protection film at the axis comprises a curing zone, the curing zone being hardened more than areas of the protection film other than the folding portion; and
   a case supporting the flexible display panel.

2. The foldable display apparatus of claim 1, wherein the curing zone is the entire folding portion of the protection film.

3. The foldable display apparatus of claim 1, wherein the curing zone comprises a plurality of curing zones, each of the curing zones extending parallel to a folding axis of the flexible display panel.

4. The foldable display apparatus of claim 1, wherein the curing zone comprises a plurality of curing zones, each of the curing zones extending perpendicular to a folding axis of the flexible display panel.

5. The foldable display apparatus of claim 1, wherein the curing zone has an oval shape.

6. The foldable display apparatus of claim 1, wherein the flexible display panel comprises a display layer configured to display an image, and
   wherein the protection film is on one surface of the display layer.

7. The foldable display apparatus of claim 6, wherein the flexible display panel comprises a window on an opposite surface of the display layer as the protection film, the window being arranged such that the displayed image is transmitted therethrough.

8. The foldable display apparatus of claim 7, wherein, when the flexible display panel is folded, tensile stress is applied to the protection film and compressive stress is applied to the window.

9. The foldable display apparatus of claim 8, wherein the flexible display panel further comprises:
   a touch screen panel and a polarization layer, each of the touch screen panel and the polarization layer being between the display layer and the window; and
   a plurality of adhesive layers, ones of the adhesive layers being between adjacent ones of the protection film, the display layer, the touch screen panel, the polarization layer, and the window.

10. The foldable display apparatus of claim 1, wherein the protection film comprises a polyimide.

11. A manufacturing method of a foldable display apparatus, the method comprising:
   attaching a protection film to one surface of a flexible display panel; and
   irradiating a folding portion of the protection film with an ultraviolet laser beam to form a curing zone at the folding portion of the protection film, the curing zone being hardened more than areas of the protection film other than the folding portion.

12. The manufacturing method of claim 11, wherein the forming of the curing zone comprises forming the curing zone to be the entire folding portion of the protection film.

13. The manufacturing method of claim 11, wherein the forming of the curing zone comprises forming a plurality of curing zones, each of the curing zones extending parallel to a folding axis of the flexible display panel.

14. The manufacturing method of claim 11, wherein the forming of the curing zone comprises forming a plurality of curing zones, each of the curing zones extending perpendicular to a folding axis of the flexible display panel.

15. The manufacturing method of claim 11, wherein the curing zone has an oval shape.

16. The manufacturing method of claim 11, further comprising preparing the flexible display panel, the preparing of the flexible display panel comprising:
- forming a display layer to be on the protection film, the display layer being configured to display an image; and
- forming a window on an opposite surface of the display layer as the protection film, the window being arranged such that the displayed image is transmitted therethrough.

17. The manufacturing method of claim 16, wherein the flexible display panel is configured to be folded in a direction such that tensile stress is applied to the protection film and compressive stress is applied to the window.

18. The manufacturing method of claim 17, wherein the preparing of the flexible display panel further comprises:
- arranging a touch screen panel and a polarization layer to be between the display layer and the window; and
- arranging an adhesive layer between adjacent ones of the protection film, the display layer, the touch screen panel, the polarization layer, and the window.

19. The manufacturing method of claim 11, wherein the protection film comprises a polyimide.

20. The manufacturing method of claim 11, wherein the irradiating of the folding portion of the protection film with the ultraviolet laser beam comprises irradiating the folding portion of the protection film with the ultraviolet laser beam for about 10 minutes to about 20 minutes.

* * * * *